United States Patent
Venkitachalam et al.

(10) Patent No.: US 6,542,094 B1
(45) Date of Patent: Apr. 1, 2003

(54) SAMPLE RATE CONVERTERS WITH MINIMAL CONVERSION ERROR AND ANALOG TO DIGITAL AND DIGITAL TO ANALOG CONVERTERS USING THE SAME

(75) Inventors: Anad Venkitachalam, Pune (IN); Rajendra Datar, Pune (IN); Krishnan Subramoniam, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/090,331

(22) Filed: Mar. 4, 2002

(51) Int. Cl.[7] ................................................ H03M 7/00
(52) U.S. Cl. ......................................... 341/61; 713/600
(58) Field of Search ........................... 341/61; 713/600, 713/400; 708/101

(56) References Cited

U.S. PATENT DOCUMENTS 6,141,671 A * 10/2000 Adams et al. ............... 708/313
6,226,758 B1 * 5/2001 Gaalaas et al. ............. 713/600

* cited by examiner

Primary Examiner—Brian Young
Assistant Examiner—Joseph Lauture
(74) Attorney, Agent, or Firm—James J. Murphy, Esq.; Winstead SEchrest & Minick

(57) ABSTRACT

A sample rate converter for converting a data stream having a first base sampling frequency to a data stream having a second base sampling frequency. Up-sampling circuitry receives first oversampled data having a first oversampling ratio with respects to the first base frequency and outputs second oversampled data having a second oversampling ratio with respects to the first base sampling frequency. Resampling circuitry resamples the second oversampled data by a resampling frequency ratio of integers representing a ratio of the first and second base frequencies and generates third oversampled data having the second oversampling ratio with respects to the second base frequency. Down-sampling circuitry then down-samples the third oversampled data and generates fourth oversampled data having the first oversampling ratio with respects to the second base frequency.

20 Claims, 5 Drawing Sheets

SAMPLE RATE CONVERTERS WITH MINIMAL CONVERSION ERROR AND ANALOG TO DIGITAL AND DIGITAL TO ANALOG CONVERTERS USING THE SAME

CROSS-REFERENCE TO RELATED APPLICATION

The following co-pending and co-assigned application contains related information and is hereby incorporated by reference: Ser. No. 09/944,736, entitled "ANALOG TO DIGITAL CONVERTERS WITH INTEGRAL SAMPLE RATE CONVERSION AND SYSTEMS AND METHODS USING THE SAME", by inventors Anand Venkitachalam, et al., filed Aug. 31, 2001; and Ser. No. 09/944,738, entitled "VARIABLE DUTY CYCLE RESAMPLING CIRCUITS AND METHODS AND SAMPLE RATE CONVERTERS USING THE SAME", by inventors Anand Venkitachalam, et al., filed Aug. 31, 2001 now U.S. Pat. No. 6,449,901.

BACKGROUND OF THE INVENTION

1. Field of Invention

The present invention relates in general to mixed analog and digital signal processing and in particular, to sample rate converters with minimal conversion error and analog to digital and digital to analog converters using the same.

2. Background of Invention

In many applications, converting data from its native analog form into the digital domain for processing, storage and transmission provides the best overall system performance. One well known example is audio processing where analog audio is digitized through analog to digital (A/D) conversion and then processed, for example filtered or compressed, and then stored on a digital storage medium such as a compact disk (CD) or digital video disk (DVD). On playback, the digital data is decompressed, as required, reconverted to analog through digital to analog (D/A) conversion, and finally presented to the end user as audible tones.

According to the Nyquist Theorem, so long as the analog waveform is sampled during A/D conversion at a sampling frequency at least twice as high as the highest frequency component, that waveform can be successively reconstructed during subsequent D/A conversion. In actual practice, oversampling A/D and D/A converters are typically used because of their relative ease in implementation. For example, in an 8x oversampling converter operating on data with a base sampling rate of 44.1 kHz, the data are sampled at a rate of 352.8 kHz. At the higher sampling rate, operations such as anti-aliasing filtering are easier since a substantial amount of the noise power is translated to frequency bands well above the band of the signal of interest.

Sample rate conversion is an additional problem which must be addressed when processing digitized analog data. For example, professional digital audio is typically recorded with a sampling rate of 48 kHz while typical playback devices operate with a base sampling rate of 44.1 kHz. Sample rate conversion, and specifically down-conversion, is therefore required to ensure that the recorded audio properly plays back. There are several existing sample rate conversion techniques, including decimation for lowering the sampling rate and interpolation for increasing the sampling rate. Notwithstanding, these techniques are still subject to some significant disadvantages including the need for substantial silicon area for fabricating the requisite interpolation/decimation filters, as well as limitations on the ability to convert to fractional sampling rates.

SUMMARY OF THE INVENTION

The principles of the present invention are demonstrated in conjunction with sample rate converters which can suitably be integrated into analog to digital and digital to analog converters and other applications. According to one particular embodiment, a sample rate converter is disclosed for converting a data stream having a first base sampling frequency to a data stream having a second base sampling frequency which includes up-sampling circuitry for receiving first oversampled data having a first oversampling ratio with respects to the first base frequency and outputing second oversampled data having a second oversampling ratio with respects to the first base sampling frequency. Resampling circuitry is included for resampling the second oversampled data by a resampling frequency ratio of integers representing a ratio between the first and second base frequencies and generating in response third oversampled data having the second oversampling ratio with respects to the second base frequency. Finally, in this particular embodiment, down-sampling circuitry is provided for down-sampling the third oversampled data to generate fourth oversampled data having the first oversampling ratio with respects to the second base frequency.

Among other things, the principles of the present invention allow for the performance of sample rate conversions with little or no conversion error based on the designer's choice. Moreover, when integrated within digital to analog converters and analog to digital converters, sample rate converters according to the inventive principles can perform such minimal error conversions without introducing aliasing into the baseband of the signal.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–5 of the drawings, in which like numbers designate like parts.

Figure 1:
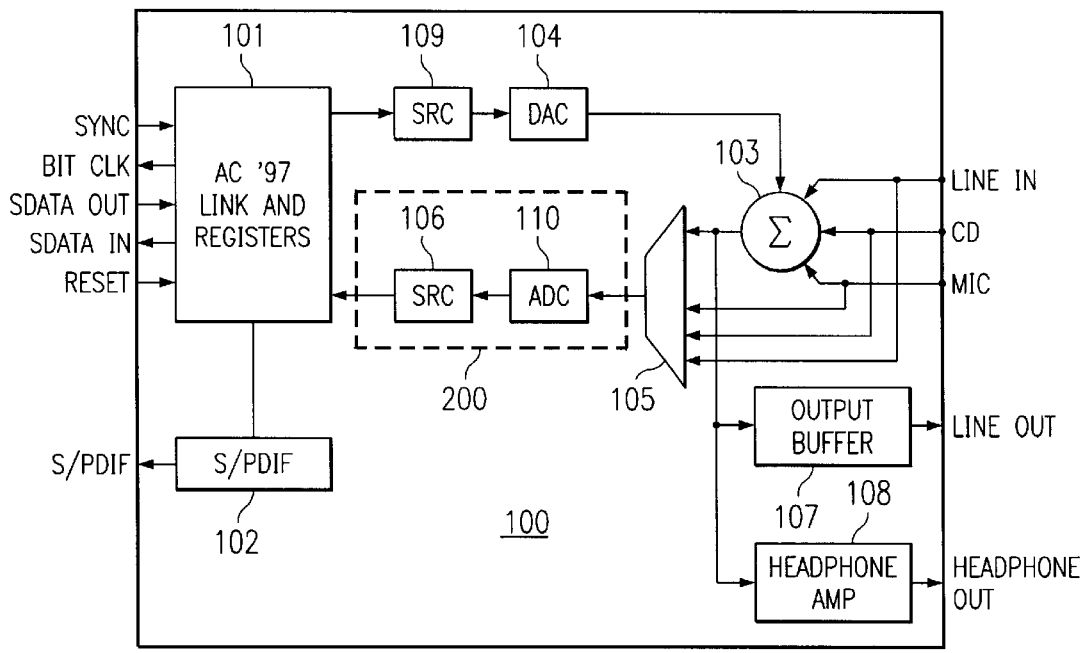
FIG. 1 is a functional block diagram of an exemplary codec suitable for describing the present inventive concepts.

FIG. 1 is a high level functional block diagram of a Codec 100 suitable for practicing the present inventive concepts. Codec 100 includes a digital AC '97 Link and associated registers 101 which support an interface with an external controller, such as a PCI bus-based controller, in accordance with the Intel Audio Codec '97 Specification, Revision 2.2. A digital output port 102 supports transmission of digital audio data to external audio appliances in accordance with the Sony-Philips Digital Interface (S/PDIF) protocol.

The analog section of Codec 100 includes a mixer 103 for mixing, as selected in register, analog audio data received from Line In, Compact Disk (CD) and Microphone (MIC) analog inputs, along with digital audio data received through AC-Link 101 and converted into analog form by digital to analog converter (DAC) 104. Multiplexer 105 selects between analog data received directly from the analog inputs and the output of mixer 103. The selected analog stream is subsequently converted to digital form by analog to digital converter (ADC) 110 before being formatted and transmitted through AC Link 101.

The mixed analog data output from mixer 103 can also be used to drive an external device, such as amplified speakers, or headphones. Hence, an output buffer 107 and a headphone amplifier 108 are also included in the illustrated embodiment.

Sample rate converters 109 and 106 under register control, are provided to change the sampling rate of data going to and from AC '97 Link 101. For example, the AC '97 specification requires that a compliant device support both the 44.1 and 48 kHz rates. As discussed further below in details, ADC 110 and SRC 106 can be advantageously integrated into a single circuit block 200.

Figure 2A:
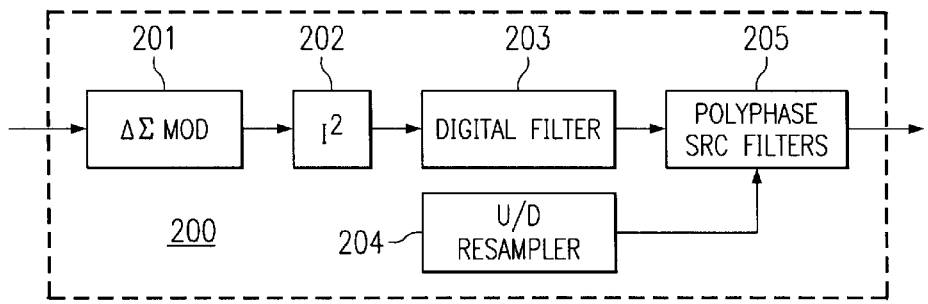
FIG. 2A is a functional block diagram of a conventional analog to digital converter—sample rate converter (ADC-SRC) subsystem.

For discussion purposes, first consider a conventional Delta-Sigma modulator-based A/D converter with sample rate conversion as shown in block 200 in FIG. 2A. In this case, the analog waveform is passed through an oversampling Delta-Sigma modulator 201 and converted to a 1-bit stream at the oversampling rate. The modulator also shapes the resulting quantization noise and generally translates that noise to a frequency band well above that of the signal interest. The modulator output is then passed through digital filters 202 and 203 which filter the 1-bit data to perform wideband anti-aliasing and decimate and convert the data to produce a stream of multiple-bit samples at a lower sampling rate.

Continuing with the conventional scheme, the multiple bit digital data then pass through polyphase SRC filters 205 under the control of up-conversion down-conversion circuitry 204 to achieve the desired final sampling rate. Typically, during sample rate conversion these data are first upconverted, then filtered and then finally down converted such that the final sampling rate is:

$$f = U/D \cdot f_{in}$$

where U is the up-sampling factor and D is the down-sampling factor.

As should be apparent from this brief description, the traditional A/D—sample rate conversion scheme is not optimized to reduce silicon area use. This is particularly true with respects to the multiple filter stages that are required to implement the various conversion processes. Hence, one of the purposes of the present concepts to combine filtering functions to minimize the required hardware, while at the same time still allow for fractional sample rate conversion.

Figure 2B:
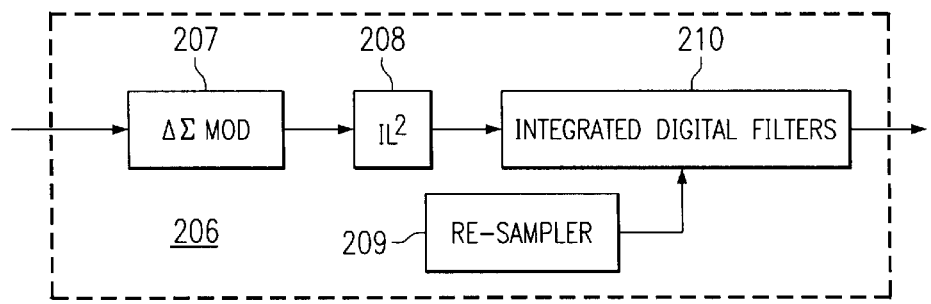
FIG. 2B is a functional block diagram of a preferred integrated analog to digital converter-sample rate converter (ADC-SRC) embodying the inventive concepts

FIG. 2B is a functional block diagram of a preferred integrated analog to digital converter—sample rate converter (ADC-SRC) 206 embodying the inventive concepts. The analog input waveform is sampled and converted into a 1-bit data stream at the selected oversampling rate by delta-sigma modulator 207. Delta-sigma modulator 207 also shapes the quantization noise as a function of the selected modulator order such that the majority of that noise is shifted to frequencies above the base-band of interest (in this case the audio band).

If the output from delta-sigma modulator 207 were to be directly resampled for sample rate conversion, high frequency noise will alias (fold-back) into the audio-band. Consequently, a filter 208 is required between the modulator output and the resampler. As discussed in detail below, filter 208 is preferably a two stage Leaky Integrator ($IL^2$) filter which filters out the high frequency noise while still remaining stable around the DC point.

The output from $IL^2$ filter 208 is then passed through an integrated digital filter (IDF) 210 which outputs multi-bit digital data at the desired new base-band rate through decimation. The decimation is controlled by resampling circuitry 209 which is described in detail below. By careful selection of $IL^2$ filter 208, the complexity and silicon area consumed by IDF 210 can be advantageously reduced. For example, for a typical audio application, the required area can be approximately halved.

The signal output from the modulator, including the data and the quantization noise, will be generally a repeating spectrum of relatively broad band. Therefore, in order to avoid aliasing back into the base-band after sampling, filter 208 should be a low pass filter with a narrow or very narrow pass-band. Moreover, the stop band attenuation must be substantial, for example, −80 db or more.

An $IL^2$ filter 208 is the preferred choice at the modulator output because it is the most practical design which minimizes the silicon area required. For example, finite impulse response (FIR) or infinite impulse response (IIR) filters with narrow pass-bands and high stop band-attenuation could be used; however, such filters would have to be of a very large order thereby requiring a large number of stages and consequently significantly more silicon area. Integrator stages of cascaded integrator comb (CIC) filters are another possibility; however, if a CIC is used in combination with a resampler, instabilities can occur, especially at DC since an ideal integrator has a pole at DC.

The preferred transfer function for a two-stage cascaded leaky integrator embodiment of $IL^2$ filter 208 is:

$$H(z) = \{z^{-1}/[1-(1-\delta)z^{-1}]\}^2$$

where δ is the leaky factor which is preferably a very small value, for example, $2^{-6}$. The maximum gain occurs at DC and is approximately 1/δ. The choice of δ is a tradeoff between hardware and filter performance; as δ increases the stop band attenuation increases but the DC gain also increases forcing a wider data path width. Advantageously, since the poles of the leaky integrator are within the unit circle, it is unconditionally stable.

Since $IL^2$ filter 208 filters out most of the high frequency components, the constraints on IDF 210 are consequently relaxed. Preferably, IDF 210 includes a decimation stage which can be implemented, for example, with a CIC filter followed by a FIR or an IIR filter of much lower order. Additionally, IDF 210 also includes magnitude and/or phase compensation filters operating at the output sample rate. These compensation filters are used to compensate for any pass-band droop and/or non-linear phase shifting introduced by the leaky integrator and decimation filters.

Resampling circuitry 209 preferably implements the decimation operation by generating an enable signal controlling the clocking of data through IDF 210. Specifically, resampler 209 generates a control signal Sample_Valid with a duty cycle approximating the ratio of the output sampling rate to the input sampling rate. In other words, IDF 210 only processes samples when Sample_Valid is active and is idled when Sample_Valid is inactive. By periodically varying the duty cycle of Sample_Valid, accumulated error due to the fact that the ratio of the output sampling rate to the input sampling rate is only approximated by Sample_Valid is minimized. For example, Sample_Valid is used to drop oversampling clocks controlling one or more of the filter stages of IDF 210 to effectuate a decimation. Sample_Valid can also be used to time a zero-order hold or similar function such that an interpolation can be implemented.

Generally, an approximate (rounded) conversion factor is calculated from the ratio of the rate of the input signal to the rate of the desired output signal in a first embodiment. Depending on the value of this ratio being closer to unity or otherwise, the objective is to calculate active and inactive clock cycles that approximate this ratio. Although this embodiment may be subject to conversion error due to the approximation, this error could still be within specifications. The approximation however helps in achieving a very efficient hardware implementation. Embodiments with zero or minimal conversion error are discussed further below.

A nominal duty cycle for Sample_Valid in terms of active clock cycles versus total clock cycles over a given period, with 1 inactive cycle per such period assumed, is then calculated which approximates the desired conversion factor. Since this nominal duty cycle is only approximate, if Sample_Valid is used uncorrected as the clock enable signal, an error will accumulate in the sample rate conversion process. Therefore, periodically the duty cycle of Sample_Valid is changed from the nominal to compensate for the accumulated error. Specifically, the duty cycle is stepped as required to introduce a canceling error equal in magnitude but opposite in sign to the accumulated error.

Figure 3A:
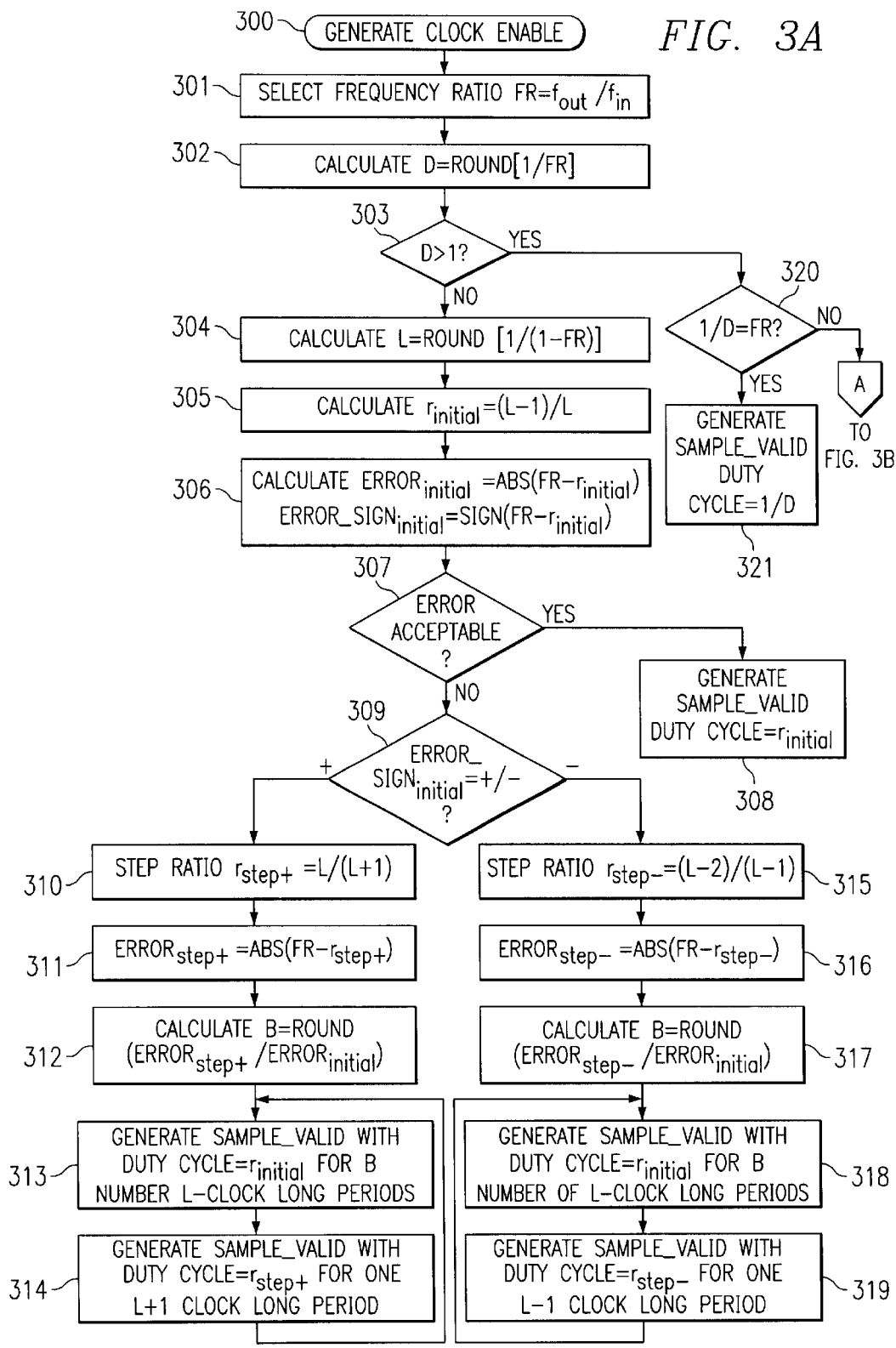
FIG. 3 is a flow chart illustrating a preferred procedure for performing synchronous re-sampling with accumulated error compensation.
Figure 3B:
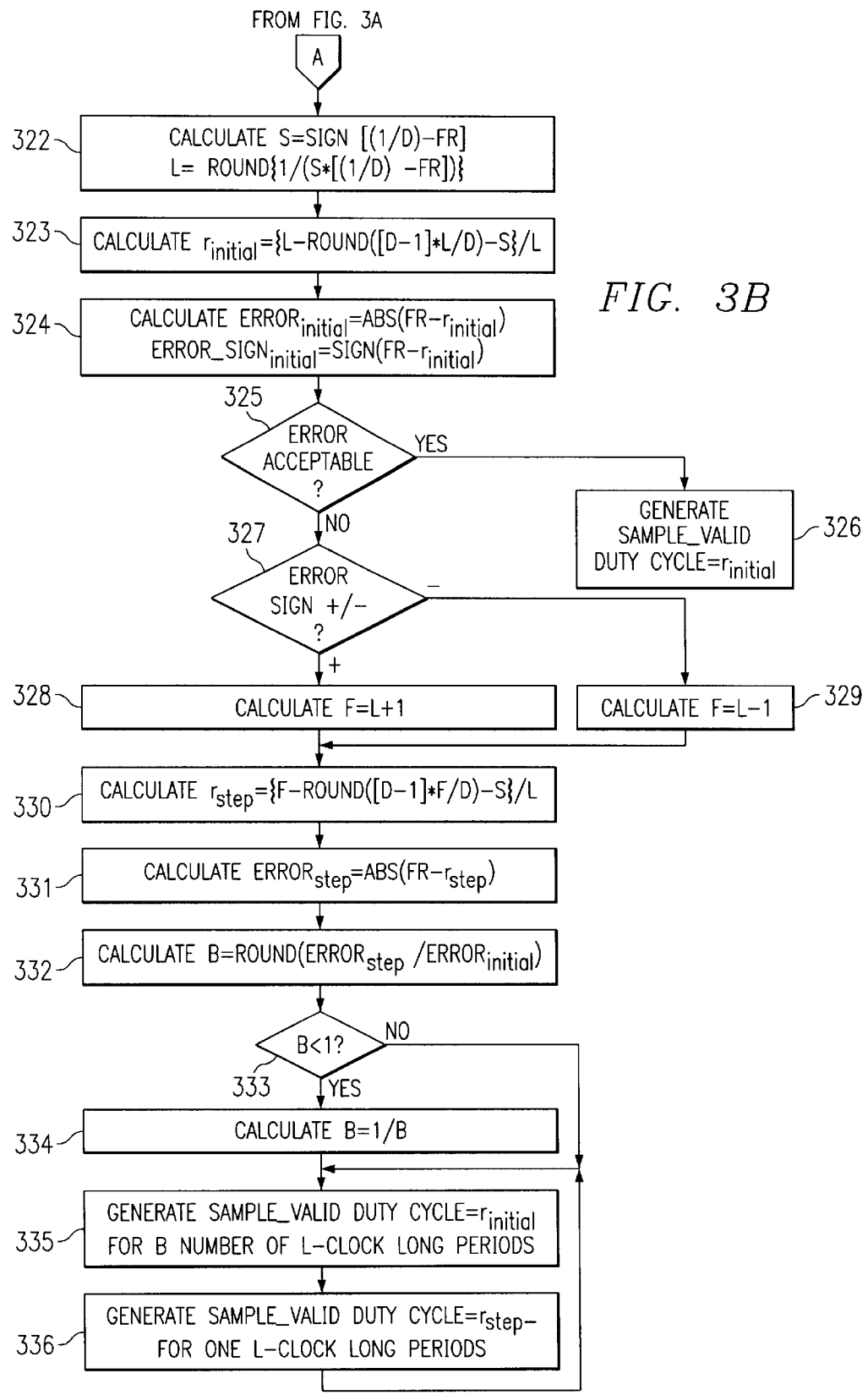

FIG. 3 is a flow chart illustrating a preferred procedure 300 for performing synchronous re-sampling, by generating Sample_Valid described above. Procedure 300 can be used either for interpolation or decimation; a basic decimation example is given below to demonstrate its application.

At Step 301, the frequency ratio (FR) of the desired output rate (frequency) to the desired input rate (frequency) is first determined. Specifically:

$$FR = f_{OUT}/f_{IN}$$

where $f_{out}$ is the frequency of the output stream and fin is the frequency of the input stream.

From the frequency ratio, a factor D is calculated at Step 302.

$$D = \text{round}[1/FR]$$

At step 303, a determination is made as to whether D is greater than to one. Consider first the case where D is not greater than one. In this case, the factor L is calculated at Step 304 where:

$$L = \text{round}[1/(1-FR)]$$

L helps minimize the distortion caused by the decimation process. L represents, in number of clock cycles, one period, including active and inactive cycles, over which the duty cycles is to be selected.

For each period L, one clock cycle of Sample_Valid will be inactive and the remaining clock cycles will be active. Taking into account this assumption, the initial ratio of active cycles to total clock cycles over the period L (i.e. the duty cycle) is calculated at Step 305:

$$r_{INITIAL} = (L-1)/L$$

As previously indicated, rINITIAL introduces a quantum of error with each period L with respects to the actual desired frequency ratio FR. This error and its sign are determined at Step 306 where:

$$\text{Error}_{INITIAL} = abs(FR - r_{INITIAL});$$

and $$\text{Error\_Sign}_{INITIAL} = \text{sign}(FR - r_{INITIAL}).$$

Over the course of B number of periods L, the accumulated error becomes:

$$\text{Error}_{ACCUMULATED} = B \cdot \text{Error}_{INITIAL}$$

If at Step 307, the error calculated at Step 306 is acceptable, then at Step 308 Sample_Valid is generated using $r_{INITIAL}$ as the duty cycle. Otherwise, the problem becomes one of selecting a value for B and a new duty cycle which can be inserted for one period after B number of L clock wide periods to introduce an error of opposite sign and magnitude to Error$_{ACCUMULATED}$.

At Step 309, the sign of initial error (Error_Sign$_{INITIAL}$), is observed. The case where Error_Sign$_{INITIAL}$ is positive will be considered first. Here, the ratio in number of active clock periods to total clock periods of Sample_Valid is stepped at Step 310;

$$r_{STEP+} = L/(L+1)$$

In the preferred embodiment, for the compensation period the number of inactive clock cycles remains fixed at one; therefore, in this case the number of active cycles is increased by 1 to L and the total number of clock in the period increased from L to L+1.

The corresponding error introduced by $r_{STEP+}$ is (Step 311):

$$\text{Error}_{STEP+} = abs(FR - r_{STEP+})$$

Consequently, a value for B is calculated at Step 312 preferably as:

$$B = \text{round}(\text{Error}_{STEP+}/\text{Error}_{INITIAL}).$$

At Steps 313 and 314, Sample_Valid is generated for a positive initial error. Specifically, Sample_Valid is generated with B number of L-clock long periods at the initial ratio (duty cycle) $r_{INITIAL}$ and the corresponding error is accumulated (Step 313). The next period is L+1 total clock periods long, with L-number of active periods and 1 inactive period, in accordance with the stepped ratio (duty cycle) $r_{STEP+}$ is (Step 314). This process is repeated to generate Sample_Valid as needed for up-converting or down-converting. A small residual error remains which is approximately:

$$\text{Error}_{RESIDUAL} = FR - [B \cdot (L-1) + L/(B \cdot L) + L + 1]$$

This error will typically be small enough to be within the given specification. Similar steps are performed when Error_sign$_{INITIAL}$ is negative at Step 309. In this case, the new inactive to active ratio is calculated at Step 315 to be:

$$r_{STEP-} = (L-2)/(L-1)$$

Here, the total number of clock cycles in the period is decreased by one to L−1 and the total number of active cycles is reduced from the initial value of L−1 to L−2. The number of inactive clock cycles per total clock cycles per period in the preferred embodiment remains at 1.

The compensating error then becomes at Step 316:

$$\text{Error}_{STEP-} = abs(FR - r_{STEP-}).$$

The period number B is calculated at Step 317 as:

$$B = \text{round}(\text{Error}_{STEP-}/\text{Error}_{INITIAL}).$$

The signal Sample_Valid is generated at Steps 318 and 319. Again, B number of periods L are made at the ratio $r_{INITIAL}$ for every L−1 clock long period at the ratio $r_{STEP-}$. In this case the residual error is:

$$\text{Error}_{RESIDUAL} = FR - [B \cdot (L-1) + (L-2)/(B \cdot L) + L - 1]$$

Returning to Step 303, now consider the case where 1/D=FR at subsequent Step 320. Here the estimated duty cycle D is close to the inverse of the desired frequency ration FR; therefore, at Step 321 Sample_Valid is generated with a duty cycle 1/D.

If D is greater than one, but not equal to 1/FR, at Steps 303 and 320, then the factor L and a sign value S are calculated at Step 322:

$$S = \text{sign}((1/D) - FR)$$

$$L = \text{round}(1/(S*(1/D) - FR]))$$

The initial ratio of active clock cycles to total clock cycles $r_{INITIAL}$, is calculated at Step 323 as:

$$r_{INITIAL} = \{L - \text{round}([D-1]*L/D) - S\}/L$$

The error and error sign are calculated at Step 324 as:

$$\text{Error}_{INITIAL} = abs(FR - r_{INITIAL});$$

and $$\text{Error\_Sign}_{INITIAL} = \text{sign}(FR - R_{INITIAL}).$$

If at Step 325, the error is found to be acceptable, then Sample_Valid is generated at Step 326 with a duty cycle of $r_{INITIAL}$. Otherwise, the error sign is evaluated at Step 327.

Consider the case where the error sign is positive at Step 327. In this case, a factor F is calculated at Step 328 as:

$$F = L + 1$$

On the other hand, if the error sign is negative at Step 327, then factor F is calculated at Step 329 as:

$$F = L - 1$$

Once F is calculated, the ratio is stepped at Step 330, where:

$$r_{STEP} = \{F - \text{round}([D-1]*F/D) - S\}/L$$

The error is then calculated (Step 331):

$$\text{Error}_{STEP} = abs(FR - r_{STEP})$$

The factor B is calculated in this case at Step 332 as:

$$B = \text{round}(\text{Error}_{STEP}/\text{Error}_{initial})$$

A test is performed at Step 333 to determine whether B is less than 1. If it is, then B becomes 1/B at Step 334 and the process continues to Steps 335 and 336 for the generation of Sample_Valid. Otherwise, the process proceeds directly to Steps 335 and 336, where Sample_Valid is generated with a duty cycle of $r_{INITIAL}$ for B number of L-clock cycle long periods and with a duty cycle of $r_{STEP}$ for one L-clock cycle long period.

The application of procedure 300 can be demonstrated with respects to the down conversion of audio data recorded at a sampling frequency 48 kHz and a sampling frequency of 44.1 kHz for pre-playback processing. A maximum error of ±1000 ppm in the 44.1 kHz data stream is the exemplary specification value. In this case:

$$FR = 44100/48000 = 0.91875$$

$$L = \text{round } [1/(1 - 0.91875)] = 12$$

$$r_{INITIAL} = (12 - 1)/12 = 0.9166$$

$$\text{Error}_{INITIAL} = 0.91875 - 0.9166 = 0.00215$$

$$\text{Error\_Sign}_{INITIAL} = \text{positive}$$

$$\text{Frequency Error} = 44100 - (0.9166 \cdot 48000)$$
$$= 100 \text{ Hz or } 2267 \text{ ppm.}$$

Since the error in the output frequency of 2267 ppm well exceeds the specified ±1000 ppm, and the initial error sign Error_Sign$_{INITIAL}$ is positive, a period L with a compensation duty cycle $r_{STEP+}$ must be inserted after every B number of periods L at the ratio $r_{INITIAL}$. The exemplary calculations are as follows:

$$r_{STEP+} = 12/(12 + 1) = 0.9230$$

$$\text{Error}_{STEP} = 0.91875 - 0.9230 = 0.00425$$

$$B = \text{round } (0.00425/0.00215) = 2$$

Figure 4:
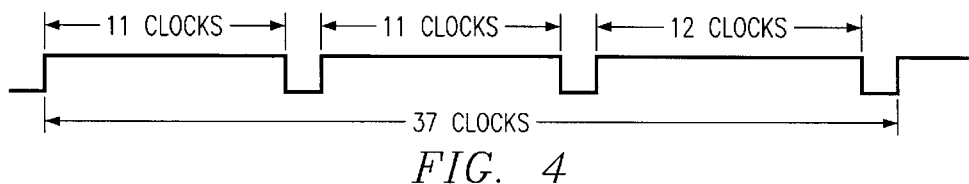
FIG. 4 is a diagram of an exemplary waveform of a control signal used to time the synchronous re-sampling operations described in FIG. 3.
Figure 5:
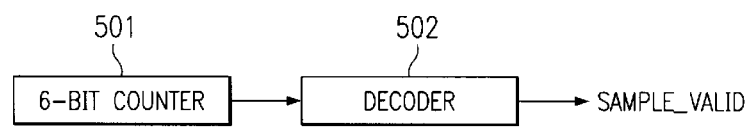
FIG. 5 is a high level functional block diagram demonstrating the generation of the waveform of FIG. 4 in hardware or software with a counter and a decoder.

The resulting waveform is then a periodic function as illustrated in FIG. 4. FIG. 5 is a high level functional block diagram demonstrating how this waveform can be generated in hardware or software with a counter 501 and a decoder 502. For this example, counter 501 counts from 0 to 36 and then wraps back to 0. Decoder 502 decodes the count to switch Sample_Valid low (inactive) for 1 clock cycle at count values of 11, 23 and 36. The error in the final frequency is well below the specified ±1000 ppm maximum $$\text{Ratio} = (2 \cdot 11 + 12)/(2 \cdot 12 + 13) = 0.918989$$

$$\text{Frequency Error} = 44100 - (0.918989 \cdot 48000)$$
$$= 8.1 \text{ Hz or } 183 \text{ ppm}$$

Now consider particular embodiments in which the desired error is 0 ppm. Here, the approximation algorithm of FIG. 3 is insufficient, since in order to achieve a 0 ppm error the frequency ratio of the input sample frequency to the output sample frequency cannot be approximated. For the ADC path, where samples are being dropped to decrease the sample rate, the salient ratio is:

Freq_ratio=Fs_out/Fs_in=44100/48000

Hence, Sample_Valid must be generated by the resampler from a ratio of integers exactly equal to the frequency ratio. The smallest such integer ratio can be selected by taking the greatest common divisor (GCD) between 44100 and 48000, which is 300. By dividing 44100 and 48000 by the GCD one obtains a minimum ratio of integers of active clock periods to total clock periods of Sample Valid:

Ratio_minimal=147/160

Using the method described above, this ratio can be generated using a modulo 160. counter 501 in resampler 209, with the count decoded to generate Sample_Valid having nine (9) sub-periods with an active to total clock ratio of 11/12 and four (4) sub-periods with an active to total clock ratio of 12/13. (One of a number of possible sequences is 11/12, 11/12, 12/13, 11/12, 11/12, 12/13, 11/12, 11/12, 12/13, 11/12, 11/12, 11/12, 12/13). Alternatively, Sample_Valid could be generated to have one active period 147 clocks long and one inactive period 13 clocks long, or some similar combination.

For the DAC path, where the sample rate is being increased, the salient ratio is:

Freq_ratio=Fs_in/Fs_out=44100/48000

Hence the minimum ratio of integers is the same as that calculated above for the ADC path.

Also assume, for discussion purposes, that the data are being processed with an oversampling ratio of 128. For an input sample rate of 48 kHz, the oversampling clock frequency will be 128 Fs_in or 6.144 MHz. Then, viewing the output of integrated digital filters 210 as a time domain multiplication of the 1-bit data generated by delta-sigma modulator 207 and Sample_Valid and assuming that the modulo 160 counter is clocked by the 128 Fs oversampling clock, the fundamental tone at the output of filters 210 is:

Freq_tone=6.144 MHz/160=38.4 kHz

For a squarewave, the fundamental tone is also accompanied by its odd harmonics. The base band frequency then repeat mirrors the fundamental tone and each of its odd harmonics.

Figure 6:
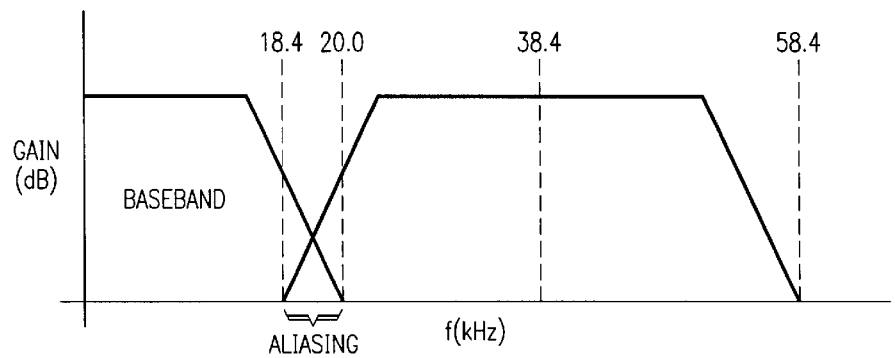
FIG. 6 is a gain versus frequency plot of the output of the resampler of FIG. 5 for an oversampling ratio of 128 Fs and a 48 kHz input sampling rate.

The spectrum for an audio application having a baseband from 0 to 20 kHz is shown in FIG. 6. In this example, aliasing occurs in the frequency range of 18.4 to 20.0 kHz where the baseband and the band centered around the fundamental tone overlap. This aliasing will produce distortion in the audio output, even though the resampling ratio has been carefully selected to produce 0 ppm error.

One possible solution to the aliasing problem is to increase the oversampling clock from the present 128 Fs. However, simply increasing the oversampling clock will result in a number of serious design issues, especially with respects to the delta sigma modulator. Besides the typical problems involved in any circuit redesign effort, such as increased time and expense, increasing the oversampling clock will also lead to increased power consumption and require increased silicon area. Hence, some other approach must be taken to the aliasing problem.

Figure 7:
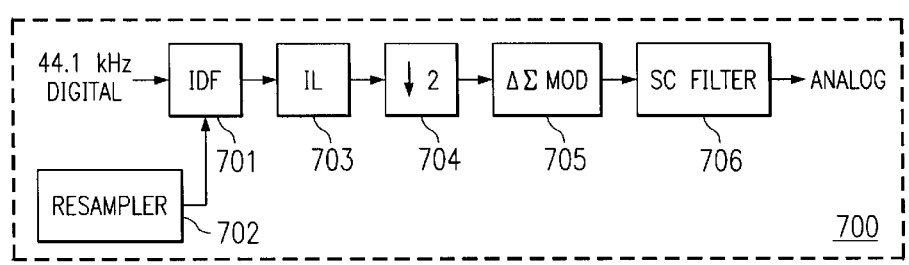
FIG. 7 is a functional block diagram of a digital to analog converter with integral sample rate conversion and minimized sample rate conversion error according to the inventive principles.

FIG. 7 illustrates an integrated DAC-SRC 700 with minimal sample rate conversion error according to the inventive concepts. In this embodiment, the 44.1 kHz digital data are interpolated by a factor of 256 by Integrated Digital Filter (IDF) 701. IDF 701 may be implemented with IIR or FIR stages followed by a CIC filter and a Zero Order Hold filter. The oversampling rate of the data output from IDF 701 is now 256 Fs_in.

The output from IDF 701 is now resampled by resampler 702 using the frequency ratio 147/160 and an oversampling clock of 256 Fs_in (12.288 MHz). The fundamental frequency is therefore shifted to:

Freq_tone=12.288 MHz/160=76.8 kHz

Figure 8:
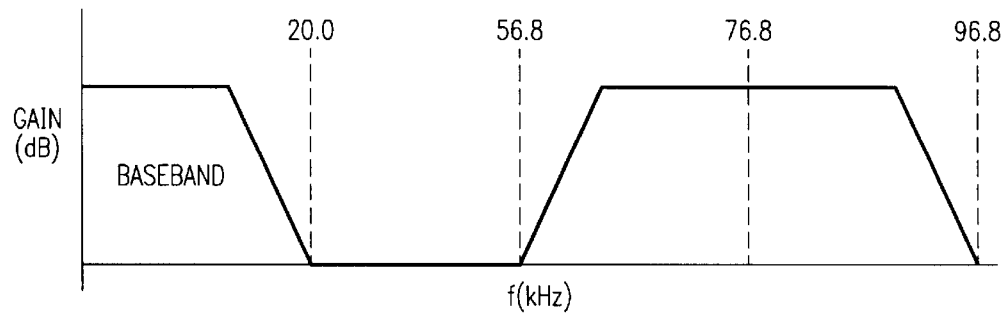
FIG. 8 is a gain versus frequency plot of the output of the resampler for an oversampling ratio of 256 Fs and an input sampling rate of 48 kHz.

The corresponding spectrum for audio data having a baseband of 0 to 20 kHz is shown in FIG. 8. The aliasing has now been eliminated since the band around the fundamental has been separated from the baseband by a sufficient margin.

After resampling, the data, now at the oversampling rate of 256 Fs_out, are filtered by a leaky integrator decimation filter (IL) 703, leaving the data in the desired baseband. Preferably, filter 703 is a first order IL filter having a transfer function:

$$H(z)=z^{-1}/(1-[1-d]z^{-1})$$

where d is the leaky coefficient and is of the order of $2^{-7}$. A first order leaky integrator is a practical design which is relatively simple to implement in hardware and therefore is silicon efficient. Moreover, it has a narrow pass-band, a reasonable stop-band and is unconditionally stable.

The data output from IL filter 703 is then decimated by decimator 704 to produce data at the 128 Fs_out sample rate. These data then drive delta-sigma modulator 705, clocked in this example by 6.144 MHz clock, which performs the first step in the digital to analog conversion. A switched-capacitor filter 706 performs the second conversion step by filtering the modulator output to generate a smooth analog signal.

Figure 9A:
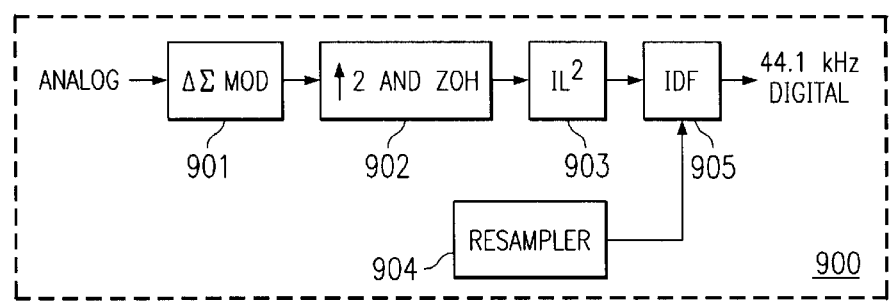
FIGS. 9A and 9B are functional block diagrams of analog to digital converters with integral sample rate conversion and minimal sample rate conversion error according to the inventive principles.

An integrated ADC-SRC 900 embodying the inventive principles is shown in FIG. 9A. Here, the analog input signal is first passed through a delta-sigma modulator 901 operating from the 128 Fs_in (6.144 MHz) oversampling clock. Delta-sigma modulator 901 converts the analog input into a digital data stream and performs noise shaping. The 128 Fs_in digital data output from modulator 901 is then interpolated (up-sampled) by digital interpolator and zero order hold filter 902 to increase the sample rate to 256 Fs_in. The interpolated data are then filtered by a leaky integrator ($IL^2$) filter 903 which is similar to filter 208.

Resampling is next performed by resampler 904 operating from the 256 Fs_in clock by controlling IDF filter 905. Again, it will be assumed that the desired resampling error is being minimized (i.e. 0 ppm) for a 48 kHz to 44.1 kHz conversion and that the resampling ratio of 147/160 is being implemented. The resampled data, at 256 Fs_out are filtered by IDF 905. IDF 905 also performs decimation by 256 to obtain 44.1 kHz digital data with 0 ppm error.

Advantageously, in sample rate converter 900, only resampler 904 is running off the 12.288 MHz clock.

Figure 9B:
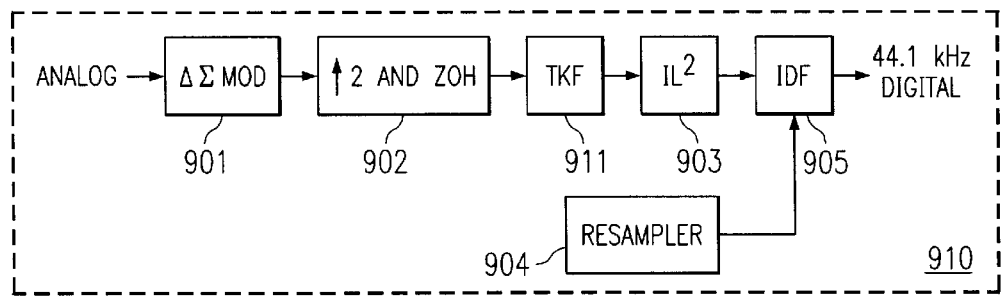

FIG. 9B illustrates an ADC-SRC architecture 910 which includes further filtering for improving signal-to-harmonic distortion plus noise (S/THD+N). This embodiment adds a first order comb filter (TKF) 911 to further filter the spectrum. Preferably, filter 911 implements the transfer function:

$$H(z)=(1-z^{-M})/(1-z^{-1})$$

If the factor M is set to 8, the S/THD+N will improve by approximately 10 dB. It should also be noted that since the modulator output is a 1-bit stream in the preferred embodiment, architecture 900 is still silicon efficient.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A sample rate converter for converting a data stream having a first base sampling frequency to a data stream having a second base sampling frequency comprising:
   up-sampling circuitry for receiving first oversampled data having a first oversampling ratio with respects to the first base frequency and outputting second oversampled data having a second oversampling ratio with respects to the first base sampling frequency;
   resampling circuitry for resampling the second oversampled data by an resampling frequency ratio of integers representing a ratio of the first and second base frequencies and generating third oversampled data having the second oversampling ratio with respects to the second base frequency; and
   down-sampling circuitry for down-sampling the third oversampled data to a generate fourth oversampled data having the first oversampling ratio with respects to the second base frequency.

2. The sample rate converter of claim 1 and further comprising a leaky integrator filter for filtering the second oversampled data output from said up-sampling circuitry.

3. The sample rate converter of claim 1 and further comprising a leaky integrator filter for filtering the third oversampled data output from said resampler circuitry.

4. The sample rate converter of claim 1 wherein said sample rate converter forms a portion of an analog to digital converter including a delta-sigma modulator for receiving data at the first base frequency and outputting the first oversampled data to said up-sampling circuitry.

5. The sample rate converter of claim 1 wherein said sample rate converter forms a portion of a digital to analog converter comprising a delta sigma modulator receiving the fourth oversampled data from said down-sampling circuitry and outputing modulated data at the second base sampling frequency.

6. The sample rate converter of claim 1 wherein said resampling circuitry comprises:
   a counter having a modulus of a denominator of the ratio of integers;
   a decoder for decoding a count of said counter to generate a control signal having a duty cycle corresponding to said resampling frequency ratio; and
   a filter responsive to the control signal for resampling the second oversampled data to generate the third oversampled data.

7. The sample rate converter of claim 1 wherein the first base sampling frequency is 48 kHz and the second base sampling frequency is 44.1 kHz.

8. The sample rate converter of claim 1 wherein the first oversampling ratio is 128 and the second oversampling ratio is 256.

9. The sample rate converter of claim 1 wherein the first base sampling frequency is 44.1 kHz, the second base sampling frequency is 48 kHz.

10. The sample rate converter of claim 9 wherein the resampling frequency ratio is 147/160.

11. A digital to analog converter with integral sample rate conversion comprising:
   a plurality of up-samplers and associated filters for up-sampling digital data at a first base sample rate by a first selected oversampling factor;
   a resampler for resampling the up-sampled data by a selected resampling ratio to generate data of a second base sample rate oversampled by the first oversampling factor, the resampling ratio being a ratio of integers representing a ratio of the first and second base sampling rates;
   a leaky integrator filter for filtering the data generated by the resampler;
   a down-sampler for down sampling the data generated by the resampler to a second oversampling rate;
   a delta-sigma modulator for modulating data from the down-sampling circuitry at the second oversampling rate to generate modulated data; and
   an output filter for generating analog data from the modulated data generated by the modulator.

12. The digital to analog converter of claim 11 wherein said plurality of up-samplers and associated filters comprises:
   a first up-sampler for up-sampling a received data stream by a first selected factor;
   an infinite impulse response filter for filtering a data stream output from said first up-sampler;
   a second up-sampler for up-sampling a received data stream by a second selected factor; and
   a comb filter for filtering a data stream output from said second up-sampler.

13. The digital to analog converter of claim 11 wherein said plurality of up-samplers and associated filters include a zero-order hold circuit.

14. The digital to analog converter of claim 11 wherein the output filter comprises a switched capacitor filter.

15. The digital to analog converter of claim 11 wherein the first base rate is 44.1 kHz, the second base rate is 48 kHz, and the resampling ratio is 147/160.

16. An analog to digital converter with integral sample rate conversion comprising:
   a delta-sigma modulator for generating digital data having a first oversampling ratio with respects to a first base rate;
   an up-sampler for up-sampling the data generated by the modulator to data with a second oversampling ratio with respects to the first base rate;
   a leaky integrator filter for filtering data output from the up-sampler;
   a resampler for resampling filtered data output from the leaky integrator filter data to generate data having the second oversampled ratio with respects to a second base rate using a resampling ratio of integers representing a ratio of the first and second base rates; and
   a down-sampler for down-sampling resampled data output from the resampler to generate data having the second base rate.

17. The analog to digital converter of claim 16 and further comprising a filter having a transfer function selected to improve signal to harmonic distortion plus noise performance of the analog to digital converter.

18. The analog to digital converter of claim 16 wherein the first base rate is 48 kHz and the second base rate is 44.1 kHz.

19. The analog to digital converter of claim 18 wherein the resampling ratio is 147/160.

20. The analog to digital converter of claim 16 wherein the first oversampling ratio is 128 and the second oversampling ratio is 256.

* * * * *

UNITED STATES PATENT AND TRADEMARK OFFICE
CERTIFICATE OF CORRECTION

PATENT NO.     : 6,542,094 B1
DATED          : April 1, 2003
INVENTOR(S)    : Venkitachalam et al.

It is certified that error appears in the above-identified patent and that said Letters Patent is hereby corrected as shown below:

<u>Title page,</u>
Item [75], Inventors, before "Venkitachalam" delete "Anad" and insert -- Anand --

Signed and Sealed this

Fifteenth Day of July, 2003

JAMES E. ROGAN
*Director of the United States Patent and Trademark Office*